United States Patent
Pease et al.

(10) Patent No.: US 8,809,747 B2
(45) Date of Patent: Aug. 19, 2014

(54) CURRENT PEAK SPREADING SCHEMES FOR MULTIPLEXED HEATED ARRAY

(75) Inventors: John Pease, San Mateo, CA (US); Neil Benjamin, East Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 150 days.

(21) Appl. No.: 13/446,335

(22) Filed: Apr. 13, 2012

(65) Prior Publication Data
US 2013/0270250 A1    Oct. 17, 2013

(51) Int. Cl.
| | |
|---|---|
| H05B 3/68 | (2006.01) |
| B23K 15/02 | (2006.01) |
| B23K 13/08 | (2006.01) |
| H05B 1/02 | (2006.01) |
| H05B 3/54 | (2006.01) |
| H05B 3/40 | (2006.01) |
| H05B 3/02 | (2006.01) |
| H05B 3/16 | (2006.01) |
| H05B 3/44 | (2006.01) |
| H05B 3/10 | (2006.01) |
| A21B 2/00 | (2006.01) |
| D02J 13/00 | (2006.01) |

(52) U.S. Cl.
USPC .............. 219/448.12; 219/443.1; 219/441.1; 219/448.17; 219/461.1; 219/462.1; 219/465.1; 219/466.1; 219/467.1; 219/468.1; 219/468.2; 219/482; 219/483; 219/484; 219/485; 219/486; 219/490; 219/492; 219/494; 219/497; 219/528; 219/534; 219/538; 219/543; 219/544; 219/553; 219/501; 392/416; 392/417; 392/418; 118/724; 118/725; 118/58; 156/345.27; 156/345.52; 700/121; 700/207; 700/210; 700/211

(58) Field of Classification Search
USPC ........... 219/443.1, 444.1, 482–486, 490, 492, 219/494, 497, 528, 534, 538, 543, 544, 553, 219/501, 446.1, 448.11, 448.12; 392/416–418; 118/724, 725, 58–69; 156/345.27, 345.52; 437/530; 700/121, 700/207, 210, 211
See application file for complete search history.

(56) References Cited

U.S. PATENT DOCUMENTS

| | | | |
|---|---|---|---|
| 3,440,883 A | 4/1969 | Lightner | |
| 4,010,412 A * | 3/1977 | Forman | ......................... 323/236 |

(Continued)

FOREIGN PATENT DOCUMENTS

| | | |
|---|---|---|
| JP | 2005123286 A | 5/2005 |
| JP | 2005294237 A | 10/2005 |
| KR | 20080058109 A | 6/2008 |

OTHER PUBLICATIONS

Ayars, Eric, "Bandgap in a Semiconductor Diode", Advanced and Intermediate Instructional Labs Workshop, AAPT Summer Meeting, California State university, Chicago, Jul. 20, 2008 http://phys.csuchico.edu/-eayars/publications/bandgap.pdf.

(Continued)

*Primary Examiner* — Dana Ross
*Assistant Examiner* — Gyounghyun Bae
(74) *Attorney, Agent, or Firm* — Buchanan Ingersoll & Rooney PC (57) ABSTRACT

A method of operating a heating plate for a substrate support assembly used to support a semiconductor substrate in a semiconductor processing apparatus, wherein the heating plate comprises power supply lines and power return lines and respective heater zone connected between every pair of power supply line and power return line. The method reduces maximum currents carried by the power supply lines and power return lines by temporally spreading current pulses for powering the heater zones.

10 Claims, 5 Drawing Sheets

(56) References Cited

U.S. PATENT DOCUMENTS

| | | | | |
|---|---|---|---|---|
| 4,099,228 | A | 7/1978 | Cohn | |
| 4,499,557 | A * | 2/1985 | Holmberg et al. | 365/163 |
| 5,059,770 | A | 10/1991 | Mahawili | |
| 5,151,871 | A * | 9/1992 | Matsumura et al. | 700/300 |
| 5,197,375 | A * | 3/1993 | Rosenbrock et al. | 99/328 |
| 5,255,520 | A | 10/1993 | O'Geary et al. | |
| 5,414,245 | A | 5/1995 | Hackleman | |
| 5,436,848 | A * | 7/1995 | Nishida et al. | 700/112 |
| 5,504,471 | A | 4/1996 | Lund | |
| 5,515,683 | A | 5/1996 | Kessler | |
| 5,536,918 | A | 7/1996 | Ohkase et al. | |
| 5,635,093 | A | 6/1997 | Arena et al. | |
| 5,665,166 | A | 9/1997 | Deguchi et al. | |
| 5,667,622 | A | 9/1997 | Hasegawa et al. | |
| 5,735,993 | A * | 4/1998 | Yoshida | 156/345.27 |
| 5,740,016 | A | 4/1998 | Dhindsa | |
| 5,802,856 | A * | 9/1998 | Schaper et al. | 62/3.7 |
| 5,851,298 | A | 12/1998 | Ishii | |
| 5,886,866 | A | 3/1999 | Hausmann | |
| 5,994,675 | A | 11/1999 | Bethune et al. | |
| 6,060,697 | A | 5/2000 | Morita et al. | |
| 6,091,060 | A | 7/2000 | Getchel et al. | |
| 6,091,062 | A * | 7/2000 | Pfahnl et al. | 219/497 |
| 6,095,084 | A | 8/2000 | Shamouilian et al. | |
| 6,100,506 | A | 8/2000 | Colelli, Jr. et al. | |
| 6,175,175 | B1 | 1/2001 | Hull | |
| 6,191,394 | B1 * | 2/2001 | Shirakawa et al. | 219/444.1 |
| 6,222,161 | B1 | 4/2001 | Shirakawa et al. | |
| 6,271,459 | B1 | 8/2001 | Yoo | |
| 6,353,209 | B1 | 3/2002 | Schaper et al. | |
| 6,373,033 | B1 * | 4/2002 | de Waard et al. | 219/497 |
| 6,403,403 | B1 | 6/2002 | Mayer et al. | |
| 6,475,336 | B1 | 11/2002 | Hubacek | |
| 6,483,690 | B1 | 11/2002 | Nakajima et al. | |
| 6,501,052 | B2 * | 12/2002 | Cox et al. | 219/486 |
| 6,512,207 | B1 | 1/2003 | Dress et al. | |
| 6,523,493 | B1 | 2/2003 | Brcka | |
| 6,566,632 | B1 | 5/2003 | Katata et al. | |
| 6,612,673 | B1 | 9/2003 | Giere et al. | |
| 6,664,515 | B2 | 12/2003 | Natsuhara et al. | |
| 6,739,138 | B2 | 5/2004 | Saunders et al. | |
| 6,740,853 | B1 * | 5/2004 | Johnson et al. | 219/444.1 |
| 6,741,446 | B2 | 5/2004 | Ennis | |
| 6,746,616 | B1 | 6/2004 | Fulford et al. | |
| 6,795,292 | B2 | 9/2004 | Grimard et al. | |
| 6,815,365 | B2 | 11/2004 | Masuda et al. | |
| 6,825,617 | B2 | 11/2004 | Kanno et al. | |
| 6,835,290 | B2 | 12/2004 | Reiter et al. | |
| 6,847,014 | B1 | 1/2005 | Benjamin et al. | |
| 6,870,728 | B1 | 3/2005 | Burket et al. | |
| 6,886,347 | B2 | 5/2005 | Hudson et al. | |
| 6,921,724 | B2 | 7/2005 | Kamp et al. | |
| 6,979,805 | B2 | 12/2005 | Arthur et al. | |
| 6,985,000 | B2 | 1/2006 | Feder et al. | |
| 6,989,210 | B2 | 1/2006 | Gore | |
| 7,075,031 | B2 | 7/2006 | Strang et al. | |
| 7,141,763 | B2 | 11/2006 | Moroz | |
| 7,173,222 | B2 | 2/2007 | Cox et al. | |
| 7,175,714 | B2 | 2/2007 | Ootsuka et al. | |
| 7,206,184 | B2 | 4/2007 | Ennis | |
| 7,230,204 | B2 | 6/2007 | Mitrovic et al. | |
| 7,250,309 | B2 | 7/2007 | Mak et al. | |
| 7,268,322 | B2 | 9/2007 | Kuibira et al. | |
| 7,274,004 | B2 | 9/2007 | Benjamin et al. | |
| 7,275,309 | B2 | 10/2007 | Matsuda et al. | |
| 7,279,661 | B2 | 10/2007 | Okajima et al. | |
| 7,297,894 | B1 | 11/2007 | Tsukamoto | |
| 7,311,782 | B2 | 12/2007 | Strang et al. | |
| RE40,052 | E * | 2/2008 | Shirakawa et al. | 219/390 |
| 7,372,001 | B2 | 5/2008 | Tachikawa et al. | |
| 7,396,431 | B2 | 7/2008 | Chen et al. | |
| 7,415,312 | B2 * | 8/2008 | Barnett et al. | 700/29 |
| 7,475,551 | B2 | 1/2009 | Ghoshal | |
| 7,480,129 | B2 | 1/2009 | Brown et al. | |
| 7,504,006 | B2 | 3/2009 | Gopalraja et al. | |
| 7,512,359 | B2 | 3/2009 | Sugiyama | |
| 7,627,844 | B2 * | 12/2009 | Rahmat et al. | 716/113 |
| 7,655,886 | B2 * | 2/2010 | Tomita et al. | 219/494 |
| 7,718,932 | B2 | 5/2010 | Steger | |
| 7,782,583 | B2 | 8/2010 | Moon | |
| 7,893,387 | B2 | 2/2011 | Ohata | |
| 7,940,064 | B2 | 5/2011 | Segawa et al. | |
| 7,952,049 | B2 | 5/2011 | Tsukamoto | |
| 7,968,825 | B2 | 6/2011 | Jyousaka et al. | |
| 8,057,602 | B2 | 11/2011 | Koelmel et al. | |
| 8,136,820 | B2 | 3/2012 | Morioka et al. | |
| 8,222,574 | B2 | 7/2012 | Sorabji et al. | |
| 8,242,417 | B2 * | 8/2012 | Tadokoro et al. | 219/494 |
| 2002/0043528 | A1 | 4/2002 | Ito | |
| 2002/0079309 | A1 * | 6/2002 | Cox et al. | 219/486 |
| 2003/0124820 | A1 * | 7/2003 | Johnsgard et al. | 438/482 |
| 2004/0083446 | A1 * | 4/2004 | Hasei | 716/21 |
| 2005/0016465 | A1 | 1/2005 | Ramaswamy et al. | |
| 2005/0215073 | A1 * | 9/2005 | Nakamura et al. | 438/778 |
| 2005/0229854 | A1 | 10/2005 | Moroz | |
| 2006/0191637 | A1 | 8/2006 | Zajac et al. | |
| 2006/0226123 | A1 | 10/2006 | Birang | |
| 2007/0125762 | A1 | 6/2007 | Cui et al. | |
| 2008/0029195 | A1 | 2/2008 | Lu | |
| 2008/0202924 | A1 | 8/2008 | Bluck et al. | |
| 2009/0000738 | A1 | 1/2009 | Benjamin | |
| 2009/0173445 | A1 | 7/2009 | Yeom et al. | |
| 2009/0183677 | A1 | 7/2009 | Tian et al. | |
| 2009/0215201 | A1 | 8/2009 | Benjamin et al. | |
| 2010/0078424 | A1 | 4/2010 | Tsukamoto et al. | |
| 2010/0116788 | A1 | 5/2010 | Singh et al. | |
| 2010/0257871 | A1 | 10/2010 | Venkatasubramanian et al. | |
| 2010/0283565 | A1 | 11/2010 | Blakes | |
| 2011/0005682 | A1 | 1/2011 | Savas et al. | |
| 2011/0033175 | A1 | 2/2011 | Kasai et al. | |
| 2011/0092072 | A1 * | 4/2011 | Singh et al. | 438/710 |
| 2011/0108706 | A1 | 5/2011 | Koyama | |
| 2011/0143462 | A1 | 6/2011 | Gaff et al. | |
| 2012/0097661 | A1 | 4/2012 | Singh | |

OTHER PUBLICATIONS

International Search Report and Written Opinion mailed Jul. 11, 2013 for PCT/US2013/035607.
Commonly-Owned U.S. Appl. No. 12/943,492, filed Nov. 10, 2010.
Commonly-Owned U.S. Appl. No. 13/237,444, filed Sep. 20, 2011.
Commonly-Owned U.S. Appl. No. 13/234,473, filed Sep. 16, 2011.
Commonly-Owned U.S. Appl. No. 13/238,396, filed Sep. 21, 2011.
Commonly-Owned U.S. Appl. No. 13/406,978, filed Feb. 28, 2012.

* cited by examiner

CURRENT PEAK SPREADING SCHEMES FOR MULTIPLEXED HEATED ARRAY

BACKGROUND

With each successive semiconductor technology generation, substrate diameters tend to increase and transistor sizes decrease, resulting in the need for an ever higher degree of accuracy and repeatability in substrate processing. Semiconductor substrate materials, such as silicon substrates, are processed by techniques which include the use of vacuum chambers. These techniques include non-plasma applications such as electron beam deposition, as well as plasma applications, such as sputter deposition, plasma-enhanced chemical vapor deposition (PECVD), resist strip, and plasma etch.

Plasma processing systems available today are among those semiconductor fabrication tools which are subject to an increasing need for improved accuracy and repeatability. One metric for plasma processing systems is increased uniformity, which includes uniformity of process results on a semiconductor substrate surface as well as uniformity of process results of a succession of substrates processed with nominally the same input parameters. Continuous improvement of on-substrate uniformity is desirable. Among other things, this calls for plasma chambers with improved uniformity, consistency and self diagnostics.

SUMMARY

Described herein is a method of operating a heating plate for a substrate support assembly used to support a semiconductor substrate in a semiconductor processing apparatus, the heating plate comprises: a first electrically insulating layer, M electrically conductive power supply lines, N electrically conductive power return lines, a planar heater zone $Z_{ij}$ connected to an i-th power supply line and a j-th power return line for every pair of i and j wherein $1 \leq i \leq M$, $1 \leq j \leq N$, i and j are integers, and the planar heater zone $Z_{ij}$ comprises one or more heater elements, and a diode serially connected to each planar heater zone between the i-th power supply line and the j-th power return line such that the diode does not allow reverse electrical current flow in a direction from the j-th power return line through the planar heater zone $Z_{ij}$ to the i-th power supply line, wherein the planar heater zones are laterally distributed across the first electrically insulating layer and operable to tune a spatial temperature profile on the semiconductor substrate; the method comprising: (a) calculating a time duration $\tau_{ij}$ for each heater zone $Z_{ij}$, based on a difference between an actual temperature and a setpoint temperature of the heater zone $Z_{ij}$, such that the heater zone $Z_{ij}$ reaches its setpoint temperature after being powered by a power supply for the time duration $\tau_{ij}$, (b) maintaining a connection between the i-th power supply line and the power supply for a time duration $T_i$; (c) during the time duration $T_i$, powering each heater zone $Z_{ij}$ connected to the i-th power supply line by maintaining a connection between the j-th power return line and an electrical ground for the time duration $\tau_{ij}$; (d) repeating step (c) for all integer values of j wherein $1 \leq j \leq N$ such that not all time durations $\tau_{ij}$ begin at the same time; (e) repeating steps (c) and (d) for all integer values of i wherein $1 \leq i \leq M$.

DETAILED DESCRIPTION

Radial and azimuthal substrate temperature control in a semiconductor processing apparatus to achieve desired critical dimension (CD) uniformity on the substrate is becoming more demanding. Even a small unintended variation of temperature may affect CD to an unacceptable degree, especially as CD approaches sub-100 nm in semiconductor fabrication processes.

A substrate support assembly may be configured for a variety of functions during processing, such as supporting the substrate, tuning the substrate temperature, and supplying radio frequency power. The substrate support assembly can comprise an electrostatic chuck (ESC) useful for electrostatically clamping a substrate onto the substrate support assembly during processing. The ESC may be a tunable ESC (T-ESC). A T-ESC is described in commonly assigned U.S. Pat. Nos. 6,847,014 and 6,921,724, which are hereby incorporated by reference. The substrate support assembly may comprise a ceramic substrate holder, a fluid-cooled heat sink (hereafter referred to as cooling plate) and a plurality of concentric planar heater zones to realize step by step and radial temperature control. Typically, the cooling plate is maintained between −20° C. and 70° C., e.g. 0° C. to 30° C. The heaters are located on the cooling plate with a layer of thermal insulator in between. The heaters can maintain the support surface of the substrate support assembly at temperatures about 0° C. to 80° C. above the cooling plate temperature. By changing the heater power within the plurality of planar heater zones, the substrate support temperature profile can be changed between center hot, center cold, and uniform. Further, the mean substrate support temperature can be changed step by step within the operating range of 0 to 80° C. above the cooling plate temperature. A small residual azimuthal temperature variation poses increasingly greater challenges as CD decreases with the advance of semiconductor technology.

Controlling temperature is not an easy task for several reasons. First, many factors can affect heat transfer, such as the locations of heat sources and heat sinks, the movement, materials and shapes of the media. Second, heat transfer is a dynamic process. Unless the system in question is in heat equilibrium, heat transfer will occur and the temperature profile and heat transfer will change with time. Third, non-equilibrium phenomena, such as plasma, which of course is always present in plasma processing, make theoretical prediction of the heat transfer behavior of any practical plasma processing apparatus very difficult if not impossible.

The substrate temperature profile in a plasma processing apparatus is affected by many factors, such as the plasma density profile, the RF power profile and the detailed structure of the various heating the cooling elements in the chuck, hence the substrate temperature profile is often not uniform and difficult to control with a small number of heating or cooling elements. This deficiency translates to non-uniformity in the processing rate across the whole substrate and non-uniformity in the critical dimension of the device dies on the substrate.

In light of the complex nature of temperature control, it would be advantageous to incorporate multiple independently controllable planar heater zones in the substrate support assembly to enable the apparatus to actively create and maintain the desired spatial and temporal temperature profile, and to compensate for other adverse factors that affect CD uniformity, e.g., non-uniformity caused by upstream or downstream processes.

A heating plate for a substrate support assembly in a semiconductor processing apparatus with multiple independently controllable planar heater zones is disclosed in commonly-owned U.S. Published Patent Publication Nos. 2011/0092072 and 2011/0143462, the disclosures of which are hereby incorporated by reference. This heating plate comprises a scalable multiplexing layout scheme of the heater zones and the power supply and power return lines. By tuning the power of the heater zones, the temperature profile during processing can be shaped both radially and azimuthally even to a high degree of granularity. In theory a large number of sufficient small heater zones providing die-by-die resolution could be achieved. Although this heating plate is primarily described for a plasma processing apparatus, this heating plate can also be used in other semiconductor processing apparatuses that do not use plasma. For example, the heating plate is useful for compensating non-uniform thermal flux caused by plasma heating to the substrate, chemical reactions, edge effects, etc.

The planar heater zones in this heating plate are preferably arranged in a defined pattern, for example, a rectangular grid, a hexagonal grid, a polar array, concentric rings or combination thereof or aribitrary pattern. For instance, it may be desired to increase the resolution at the edge of the wafer. Each planar heater zone may be of any suitable size and may have one or more heater elements. If a planar heater zone has two or more heater elements, the heater elements in the planar heater zone are turned on or off together. To minimize the number of electrical connections, power supply lines and power return lines are arranged such that each power supply line is connected to a different group of planar heater zones, and each power return line is connected to a different group of planar heater zones wherein each planar heater zone being in one of the groups connected to a particular power supply line and one of the groups connected to a particular power return line. No two planar heater zones are connected to the same pair of power supply and power return lines. Thus, a particular heater zone can be activated by directing electrical current through a pair of power supply and power return lines to which this particular planar heater zone is connected. The power of the heater elements is preferably smaller than 20 W, more preferably 5 to 10 W. The heater elements may be resistive heaters, such as polyimide heaters, silicone rubber heaters, mica heaters, metal heaters (e.g. W, Ni/Cr alloy, Mo or Ta), ceramic heaters (e.g. WC), semiconductor heaters or carbon heaters. The heater elements may be screen printed, wire wound or etched foil heaters. In one embodiment, each planar heater zone is not larger than four device dies being manufactured on a semiconductor substrate, or not larger than two device dies being manufactured on a semiconductor substrate, or not larger than one device die being manufactured on a semiconductor substrate, or from 16 to 100 $cm^2$ in area, or from 1 to 15 $cm^2$ in area, or from 2 to 3 $cm^2$ in area to correspond to the device dies on the substrate. The thickness of the heater elements may range from 2 micrometers to 1 millimeter, preferably 5-80 micrometers. To allow space between heater zones and/or power supply and power return lines, the total area of the planar heater zones may be up to 90% of the area of the upper surface of the substrate support assembly, e.g. 50-90% of the area. The power supply lines or the power return lines (power lines, collectively) may be arranged in gaps ranging from 1 to 10 mm between the planar heater zones, or in separate planes separated from the planar heater zones plane by electrically insulating layers. The power supply lines and the power return lines are preferably made as wide as the space allows, in order to carry large current and reduce Joule heating. In one embodiment, in which the power lines are in the same plane as the planar heater zones, the width of the power lines is preferably between 0.3 mm and 2 mm. In another embodiment, in which the power lines are on different planes than the planar heater zones, the width of the power lines can be as large as the planar heater zones, e.g. for a 300 mm chuck, the width can be 1 to 2 inches. The materials of the power lines may be the same as or different from the materials of the heater elements. Preferably, the materials of the power lines are materials with low resistivity, such as Cu, Al, W, Inconel® or Mo.

Figure 1:
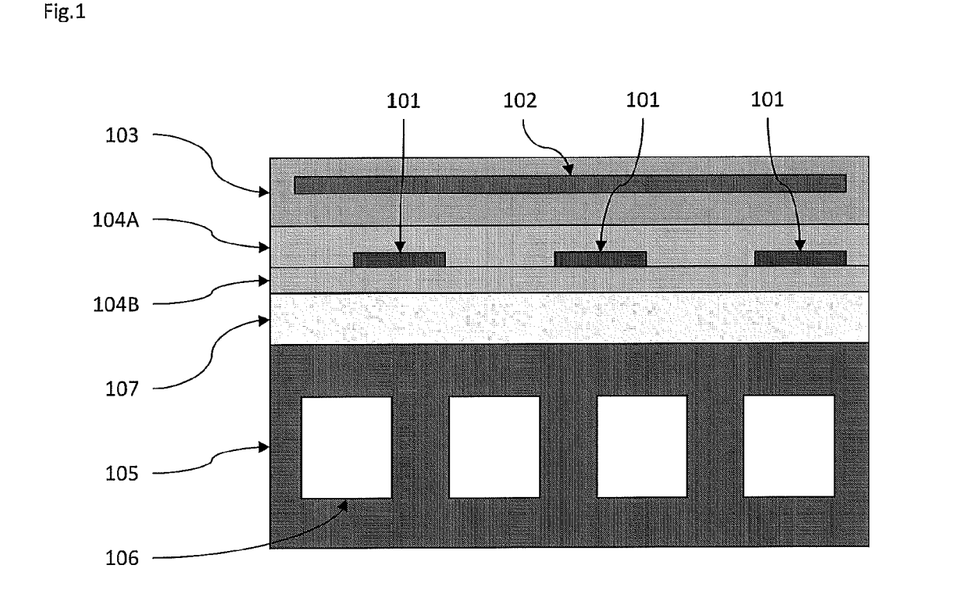
FIG. 1 is a schematic of the cross-sectional view of a substrate support assembly in which a heating plate with an array of planar heater zones is incorporated, the substrate support assembly also comprising an electrostatic chuck (ESC).
Figure 2:
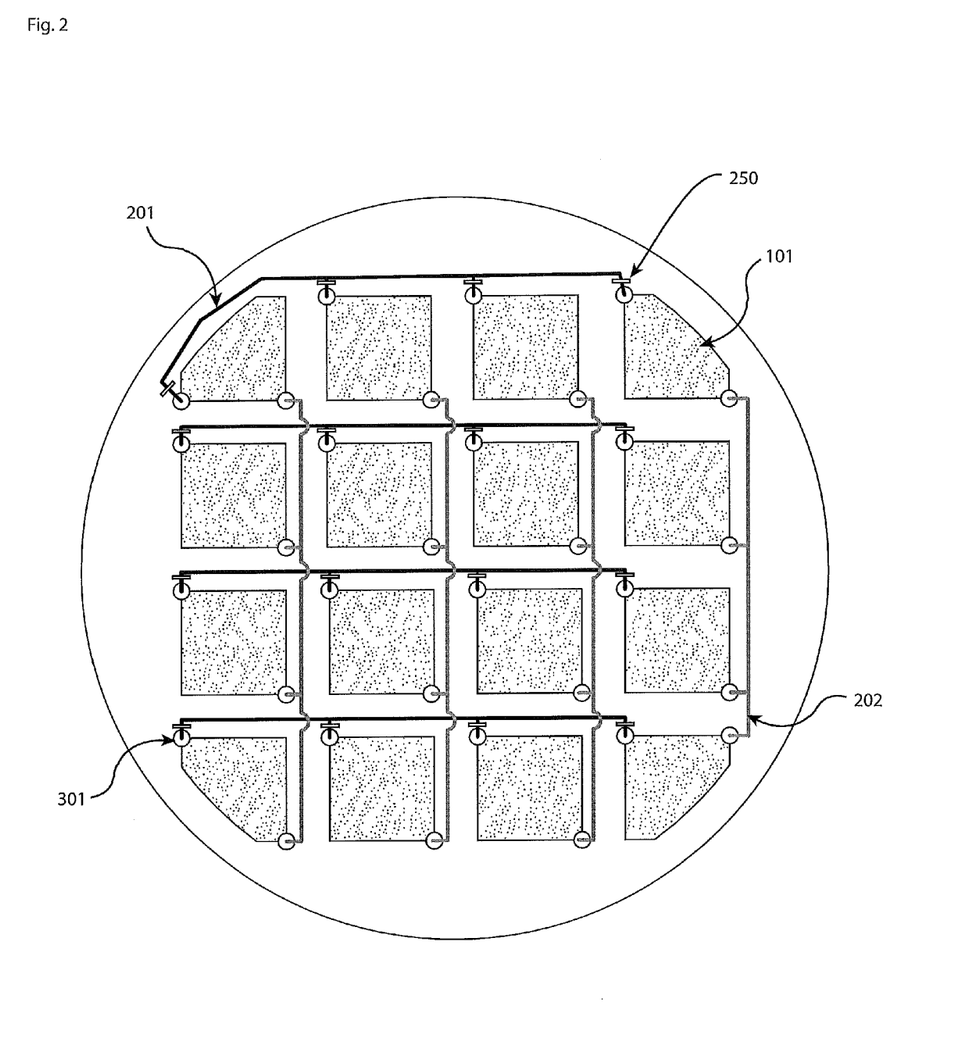
FIG. 2 illustrates the topological connection between power supply and power return lines to an array of heater zones in one embodiment of a heating plate which can be incorporated in a substrate support assembly.

FIGS. 1-2 show a substrate support assembly comprising one embodiment of the heating plate having an array of heater zones 101 incorporated in two electrically insulating layers 104A and 104B. The electrically insulating layers may be a polymer material, an inorganic material, a ceramic such as silicon oxide, alumina, yttria, aluminum nitride or other suitable material. The substrate support assembly further comprises (a) an ESC having a ceramic layer 103 (electrostatic clamping layer) in which an electrode 102 (e.g. monopolar or bipolar) is embedded to electrostatically clamp a substrate to the surface of the ceramic layer 103 with a DC voltage, (b) a thermal barrier layer 107, (c) a cooling plate 105 containing channels 106 for coolant flow.

As shown in FIG. 2, each of the heater zones 101 is connected to one of the power supply lines 201 and one of the power return lines 202. No two heater zones 101 share the same pair of power supply 201 and power return 202 lines. By suitable electrical switching arrangements, it is possible to connect a pair of power supply 201 and power return 202 lines to a power supply (not shown), whereby only the heater zone connected to this pair of lines is turned on. The time-averaged heating power of each heater zone can be individually tuned by time-domain multiplexing. In order to prevent crosstalk between different heater zones, a diode 250 is serially connected between each heater zone and the power supply lines connected thereto (as shown in FIG. 2), or between each heater zone and the power return lines connected thereto (not shown).

A substrate support assembly can comprise an embodiment of the heating plate, wherein each planar heater zone of the heating plate is of similar size to or smaller than a single device die or group of device dies on the substrate so that the substrate temperature, and consequently the plasma etching process, can be controlled for each device die position to maximize the yield of devices from the substrate. The scalable architecture of the heating plate can readily accommodate the number of planar heater zones required for die-by-die substrate temperature control (typically more than 100 dies on a substrate of 300-mm diameter) with minimal number of power supply lines, power return lines, and feedthroughs in the cooling plate, thus reduces disturbance to the substrate temperature, the cost of manufacturing and complexity of the substrate support assembly. Although not shown, the substrate support assembly can comprise features such as lift pins for lifting the substrate, helium back cooling, temperature sensors for providing temperature feedback signals, voltage and current sensors for providing heating power feedback signals, power feed for heaters and/or clamp electrode, and/or RF filters.

Figure 3:
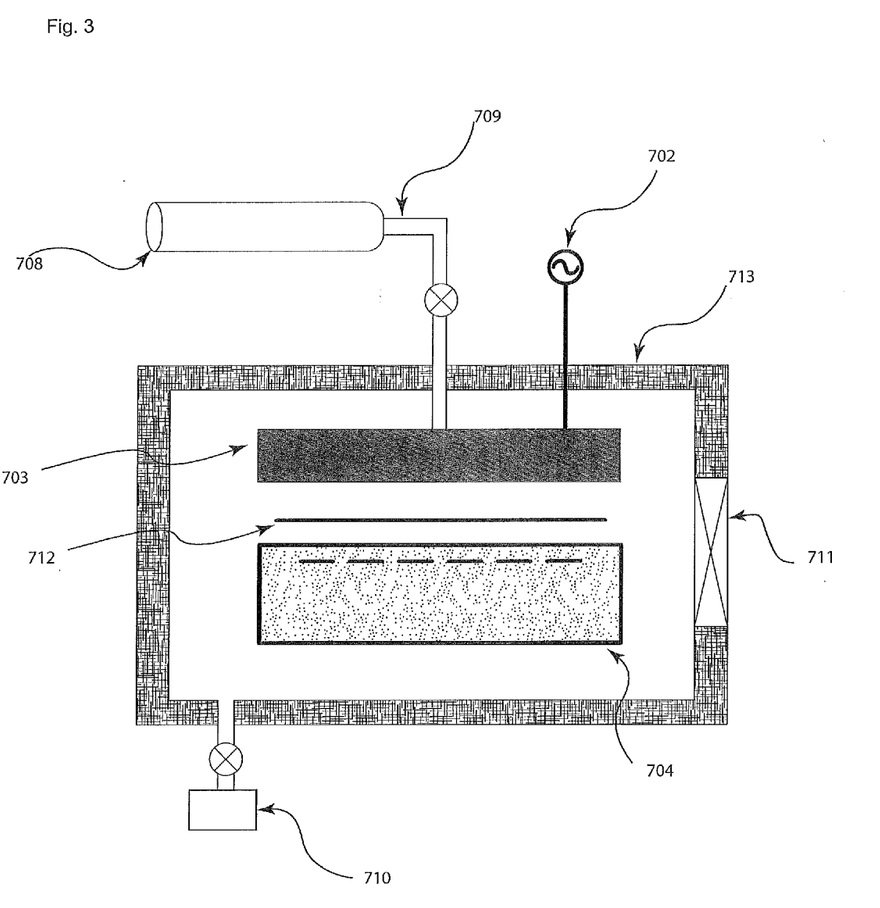
FIG. 3 is a schematic of an exemplary plasma processing chamber, which can include a substrate support assembly described herein.

As an overview of how a plasma processing chamber operates, FIG. 3 shows a schematic of a plasma processing chamber comprising a chamber 713 in which an upper showerhead electrode 703 and a substrate support assembly 704 are disposed. A substrate 712 is loaded through a loading port 711 onto the substrate support assembly 704. A gas line 709 supplies process gas to the upper showerhead electrode 703 which delivers the process gas into the chamber. A gas source 708 (e.g. a mass flow controller supplying a suitable gas mixture) is connected to the gas line 709. A RF power source 702 is connected to the upper showerhead electrode 703. In operation, the chamber is evacuated by a vacuum pump 710 and the RF power is capacitively coupled between the upper showerhead electrode 703 and a lower electrode in the substrate support assembly 704 to energize the process gas into a plasma in the space between the substrate 712 and the upper showerhead electrode 703. The plasma can be used to etch device die features into layers on the substrate 712. The substrate support assembly 704 may have heaters incorporated therein. It should be appreciated that while the detailed design of the plasma processing chamber may vary, RF power is coupled through the substrate support assembly 704.

Figure 4:
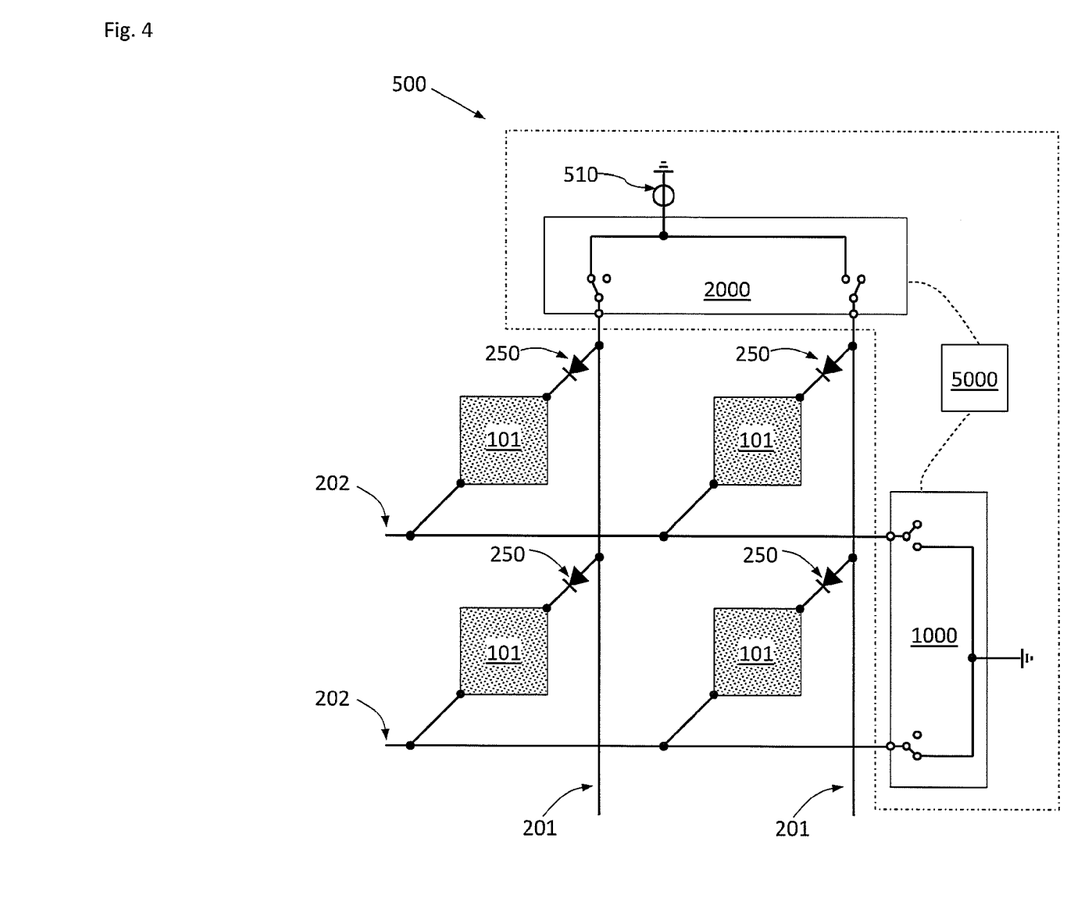
FIG. 4 shows a circuit diagram of a controller, according to an embodiment, configured to control and power each heater zone in the heating plate.

FIG. 4 shows a circuit diagram of a controller 500 configured to control and power each heater zone 101 in the heating plate to generate a desired temperature profile. For simplicity, only four heater zones are shown. This controller 500 can work with any number of heater zones.

The controller 500 comprises a multiplexer 1000 connected to all the power return lines 202, a multiplexer 2000 connected to all the power supply lines 201. The multiplexer 2000 can connect each power supply line 201 to a power source 510 or an electrically isolated terminal, independent of other power supply line(s). The multiplexer 1000 can connect each power return line 202 to the electrical ground or an electrically isolated terminal, independent of other power return line(s). A processor 5000 (e.g. a micro controller unit, a computer, etc.) controls the multiplexers 1000 and 2000. A heater zone 101 is powered when and only when the power supply line 201 connected to this heater zone 101 is connected to the power supply 510 and the power return line 202 connected to this heater zone 101 is connected to the electrical ground.

The controller 500 further comprises one or more temperature sensors configured to read actual temperature of respective locations. The locations of the temperature sensors and the locations of each heater zone 101 may or may not coincide. The temperature of each heater zone 101 can be obtained or estimated by actual measurements, calibration or interpolation based on a theoretical or empirical model. For example, the estimated measurement can be based on a calibrated estimate, predictive estimate, or modeled estimate.

The controller 500 calculates a time duration r for each heater zone 101 based on the difference between the obtained or estimated temperature and a setpoint temperature of the heater zone 101 such that the heater zone 101 reaches its setpoint temperature after being powered for the time duration $\tau$. The setpoint temperature of each heater zone 101 is determined by a desired temperature profile of the entire heating plate. Alternatively, each heater power may be calculated in a model based fashion based on real time feedback on a zone by zone basis, or in an interpolated fashion based on a result of a model derived from prior calibrations so that the calculation of the time duration $\tau$ for each heater zone takes feed forward effects of prior or subsequent substrate treatment processes into consideration.

In a time-domain multiplexing scheme, the controller 500 maintains a connection between one power supply line 201 at a time and the power supply 510 for a controller time duration T, during which the controller 500 maintains a connection between the electrical ground and each heater zone 101 connected to the one power supply line 201 for the heater zone time duration $\tau$ calculated for that heater zone 101. If the power supply 510 outputs a constant DC voltage $V_0$ and all the heater zones 101 have a same electrical resistance $R_0$, the average heating power of a heater zone 101 is proportional to the average of its $\tau/T$. The controller 500 starts the heater zone time duration $\tau$ for each heater zone 101 at the beginning of the controller time duration T, which however leads to a peak in the total current carried by the one power supply line 201 at the beginning of the time duration T. Advantageously, in a time-domain multiplexing scheme according to an embodiment, the controller can temporally spread the beginnings of the heater zone time durations $\tau$ across the controller time duration T, i.e. not starting all the heater zone time durations $\tau$ at the same time, so as to decrease the maximum total current the one supply line 201 carries throughout the controller time duration T.

For convenience, an exemplary heating plate with M (e.g. from 2 to 100) power supply lines, N (e.g. from 2 to 100) power return lines and M×N heater zones, and a heater zone $Z_{ij}$ connected to the i-th power supply line and j-th power return line for every pair of i and j (1≤i≤M, 1≤j≤N, i and j are integers), will be used to describe time-domain multiplexing schemes according to embodiments. A time duration $\tau$ of the heater zone $Z_{ij}$ is designated as $\tau_{ij}$. A time duration T of the i-th power supply line is designated as $T_i$.

In a time-domain multiplexing scheme according to one embodiment, the controller powers heater zones $Z_{i1}$ through $Z_{iN}$ sequentially during $T_i$, when $$\sum_{j=1}^{N} \tau_{ij} \le T_i.$$

Namely, among all the heater zones $Z_{i1}$ through $Z_{iN}$ connected to the i-th power supply line, no more than one heater zone is powered at any given time during $T_i$.

In a time-domain multiplexing scheme according to another embodiment, wherein $$\sum_{j=1}^{N} \tau_{ij} > T_i,$$

the controller 500 can use a method as follows to determine the locations of $\tau_{ij}$ in $T_i$ in order to reduce the maximum total current carried by the i-th power supply line. For convenience, $\alpha_{ij}$ and $\beta_{ij}$ represent the beginning time point and ending time point of $\tau_{ij}$ relative to the beginning of the time duration $T_i$, wherein $0 \le \alpha_{ij} \le \beta_{ij} \le T_i$. The controller 500 determines $\alpha_{ij}$ and $\beta_{ij}$ according to the following rules: (i) $\alpha_{i1}=0$; (ii) $\alpha_{i(j+1)}=\beta_{ij}$ and $\beta_{i(j+1)}=(\alpha_{i(j+1)}+\tau_{i(j+1)})$ if $(\alpha_{i(j+1)}+\tau_{i(j+1)}) \le T_i$; (iii) splitting $\tau_{i(j+1)}$ into one duration between $\alpha_{i(j+1)}$ and $T_i$ and another duration between 0 and $(\alpha_{i(j+1)}+\tau_{i(j+1)}-T_i)$ if $(\alpha_{i(j+1)}+\tau_{i(j+1)})>T_i$, wherein j iterates from 1 through (N−1).

The maximum total current carried by the i-th power supply line thus meets the condition of $$I_i \leq \left\lceil \frac{\sum_{j=1}^{N} \tau_{ij}}{T_i} \right\rceil \cdot \frac{V_0}{R_0},$$

wherein "⌈x⌉" is the ceiling function, i.e. this assumes that all resistances are the same and the smallest integer not less than x. However, the voltage V may sag with increasing load and the heaters may not have exactly the same area in which case V and R are not the same for each heater zone and the equation should be modified to have $V_0/R_0$ inside the brackets.

Figure 5:
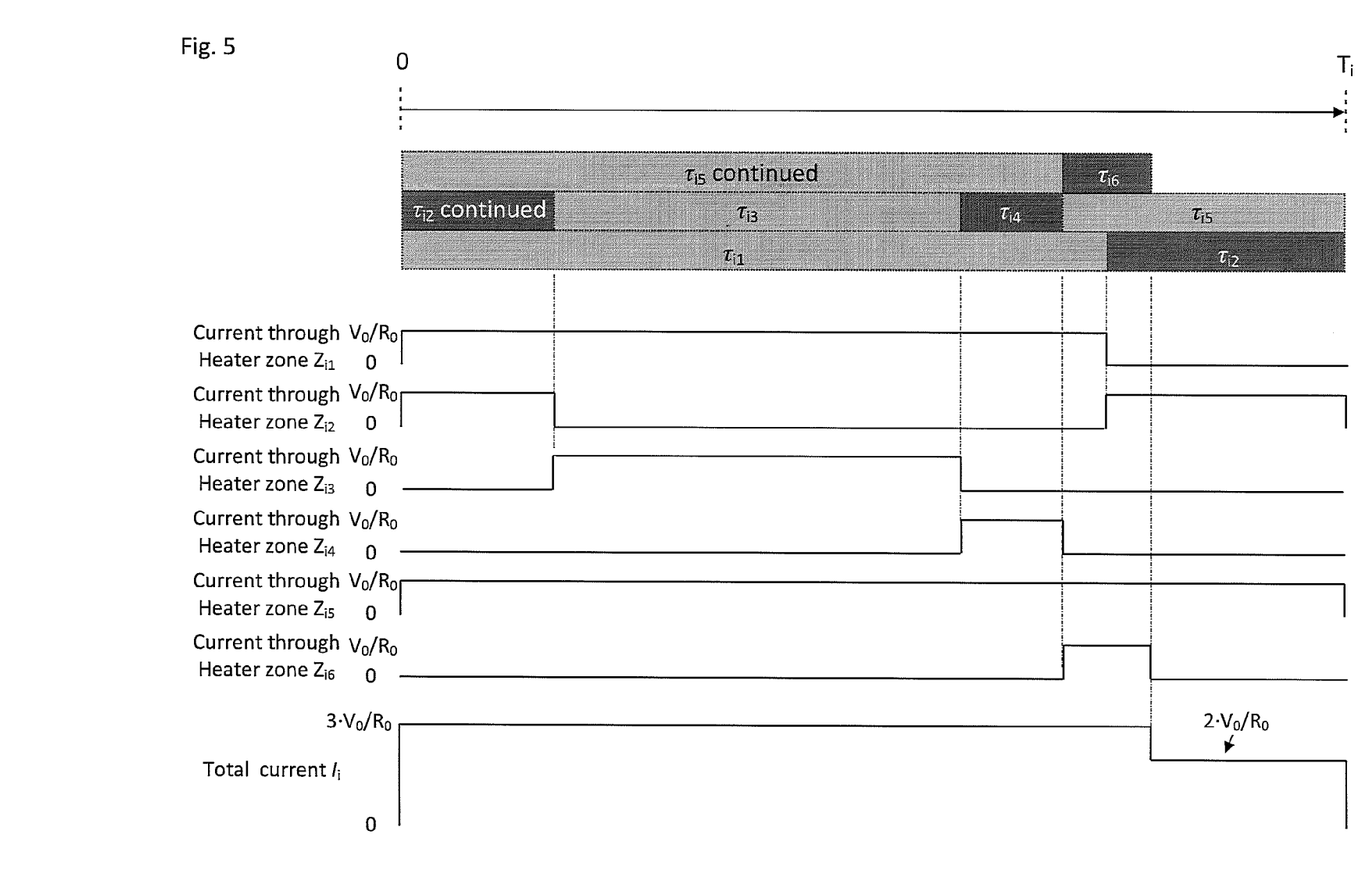
FIG. 5 shows traces of currents through heater zones of an exemplary heating plate.

FIG. 5 shows a result of applying this scheme to an exemplary heating plate with 6 heater zones $Z_{i1}$ through $Z_{i6}$ connected to the i-th power supply line. The current traces show current through $Z_{i1}$, $Z_{i2}$, $Z_{i3}$, $Z_{i4}$, $Z_{i5}$, $Z_{i6}$ and total current $I_i$ carried by the i-th power supply line as functions of time. At any given time during $T_i$, $I_i$ is at most $3 V_0/R_0$.

In a time-domain multiplexing scheme according to another embodiment, the controller 500 moves one or more $\tau_{ij}$ from one duration $T_i$ to the next duration $T_i$.

In a time-domain multiplexing scheme according to yet another embodiment, the controller 500 adjusts each $T_i$ to satisfy the condition $$T_i = \sum_{j=1}^{N} \tau_{ij}$$

and powers the heater zones $Z_{i1}$ through $Z_{iN}$ sequentially during $T_i$, so that one and only one of these heater zones $Z_{i1}$ through $Z_{iN}$ is powered at any given time during $T_i$ and thus $I_i = V_0/R_0$ in the entire $T_i$. This scheme is especially suitable for applications wherein time durations $\tau_{ij}$ are relatively short, i.e. the differences between actual temperatures and setpoint temperatures of the heater zones $Z_{ij}$ are small, because reducing $T_i$ to $$\sum_{j=1}^{N} \tau_{ij}$$

reduces temperature fluctuations on the heater zones $Z_{ij}$.

Benefits of reducing maximum current carried by the supply lines include a smaller power supply, smaller footprint of the power supply lines, and lower magnetic fields generated by currents carried by the power supply lines.

The described schemes can also be modified so that the controller 500 maintains a connection between one power return line 202 at a time and the electrical ground for a time duration T, during which the controller 500 maintains a connection between the power supply 510 and each heater zone 101 connected to the one power return line 202 for the time duration τ calculated for that heater zone 101.

In order to prevent detectable temperature modulation, the switching frequencies and the entire multiplexing scheme are preferably sufficiently rapid that each heater zone gets addressed frequently (at least 1 Hz).

While a controller configured to control and power each heater zone in the heating plate and time-domain multiplexing schemes for a heating plate with an array of heater zones have been described in detail with reference to specific embodiments thereof, it will be apparent to those skilled in the art that various changes and modifications can be made, and equivalents employed, without departing from the scope of the appended claims.

We claim:

1. A method of operating a heating plate for a substrate support assembly used to support a semiconductor substrate in a semiconductor processing apparatus, wherein the heating plate includes a first electrically insulating layer, M electrically conductive power supply lines, N electrically conductive power return lines, an array of multiple planar heater zones wherein a respective planar heater zone $Z_{ij}$ is connected to an i-th power supply line and a j-th power return line wherein 1≤i≤M, 1≤j≤N, i and j are integers, and the planar heater zone $Z_{ij}$ comprises one or more heater elements, and a diode serially connected to planar heater zone $Z_{ij}$ between the i-th power supply line and the j-th power return line such that the diode does not allow reverse electrical current flow in a direction from the j-th power return line through the planar heater zone $Z_{ij}$ to the i-th power supply line, and wherein the planar heater zones are laterally distributed across the first electrically insulating layer and operable to tune a spatial temperature profile on the semiconductor substrate, and wherein no two planar heater zones are connected to the same pair of i-th power supply line and j-th power return line; the method comprising:

(a) calculating a time duration $T_{ij}$ for planar heater zone $Z_{ij}$ in the array of multiple heater zones, based on a difference between an actual temperature or an estimated temperature and a setpoint temperature of the planar heater zone $Z_{ij}$, such that the planar heater zone $Z_{ij}$ reaches its setpoint temperature after being powered by a power supply for the time duration $T_{ij}$;

(b) maintaining a connection between the i-th power supply line and the power supply for a controller time duration $T_i$; and (c) during the controller time duration $T_i$, powering the planar heater zone $Z_{ij}$ connected to the i-th power supply line by maintaining a connection between the j-th power return line and an electrical ground for the heater zone time duration $\tau_{ij}$;

(d) repeating step (c) for all integer values of j wherein 1≤j≤N such that not all time durations $T_{ij}$ begin at the same time;

(e) repeating steps (c) and (d) for all integer values of i wherein 1≤i≤M.

2. The method of claim 1, wherein N is an integer between 2 and 100 inclusive, and M is an integer between 2 and 100 inclusive.

3. The method of claim 1, wherein $$\sum_{j=1}^{N} \tau_{ij} \leq T_i,$$

and wherein step (d) further comprises, powering each planar heater zone $Z_{ij}$ connected to the i-th power supply line sequentially such that no more than one of planar heater zones $Z_{ij}$ is powered at any given time during $T_i$.

4. The method of claim 1, wherein $$\sum_{j=1}^{N} \tau_{ij} > T_i,$$

and the time duration $\tau_{ij}$ begins at time point $\alpha_{ij}$ and ends at time point $\beta_{ij}$ relative to the beginning of the time duration $T_i$, in step (d), determining $\alpha_{ij}$ and $\beta_{ij}$ according to the following rules:
(i) $\alpha_{i1}=0$; (ii) $\alpha_{i(j+1)}=\beta_{ij}$ and $\beta_{i(j+1)}=(\alpha_{i(j+1)}+\tau_{i(j+1)})$ if $(\alpha_{i(j+1)}+\tau_{i(j+1)}) \leq T_i$; (iii) spliting $T_{i(j+1)}$ into one duration between $\alpha_{i(j+1)}$ and $T_i$ and another duration between 0 and $(\alpha_{i(j+1)}+\tau_{i(j+1)}-T_i)$ if $(\alpha_{i(j+1)}+\tau_{i(j+1)}) \leq T_i$.

5. The method of claim 1, wherein step (d) further comprises moving one or more $\tau_{ij}$ from one duration $T_i$ to a next duration $T_i$.

6. The method of claim 1, wherein in step (c) further comprises adjusting $T_i$ such that $$T_i = \sum_{j=1}^{N} \tau_{ij}$$

and wherein step (d) further comprises powering each planar heater zone $Z_{ij}$ connected to the i-th power supply line sequentially such that one and only one of the planar heater zones $Z_{ij}$ is powered at any given time during $T_i$.

7. The method of claim 1, wherein the estimated temperature of the heater zone $Z_{ij}$ is calculated in a model based fashion based on real time feedback of the heater zone $Z_{ij}$.

8. The method of claim 1, wherein the estimated temperature of the heater zone $Z_{ij}$ is based on previously measured calibration data.

9. The method of claim 1, wherein the estimated temperature of the heater zone $Z_{ij}$ is calculated in an interpolated fashion based on a result of a model derived from prior calibrations so that the calculation of the time duration $T_{ij}$ for the each heater zone $Z_{ij}$ takes feed forward effects of prior substrate treatment processes into consideration.

10. The method of claim 1, wherein the estimated temperature of the heater zone $Z_{ij}$ is calculated in an interpolated fashion based on a result of a model derived from prior calibrations so that the calculation of the time duration $T_{ij}$ for the each heater zone $Z_{ij}$ takes feed forward effects of subsequent substrate treatment processes into consideration.

* * * * *